United States Patent
Chandrashekar et al.

(10) Patent No.: US 8,058,170 B2
(45) Date of Patent: Nov. 15, 2011

(54) METHOD FOR DEPOSITING THIN TUNGSTEN FILM WITH LOW RESISTIVITY AND ROBUST MICRO-ADHESION CHARACTERISTICS

(75) Inventors: Anand Chandrashekar, Sunnyvale, CA (US); Mirko Glass, Freital (DE); Raashina Humayun, Fremont, CA (US); Michael Danek, Cupertino, CA (US); Kaihan Ashtiani, Cupertino, CA (US); Feng Chen, Sunnyvale, CA (US); Lana Hiului Chan, Northborough, MA (US); Anil Mane, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/407,541

(22) Filed: Mar. 19, 2009

(65) Prior Publication Data

US 2010/0159694 A1 Jun. 24, 2010

Related U.S. Application Data

(60) Provisional application No. 61/061,078, filed on Jun. 12, 2008.

(51) Int. Cl.
*H01L 21/44* (2006.01)
(52) U.S. Cl. ............... 438/677; 438/685; 257/E21.575
(58) Field of Classification Search .................. 438/677, 438/648, 656, 685
See application file for complete search history.

(56) References Cited

U.S. PATENT DOCUMENTS

| | | | |
|---|---|---|---|
| 4,746,375 A | 5/1988 | Lacovangelo |
| 4,804,560 A | 2/1989 | Shioya et al. |
| 5,028,565 A | 7/1991 | Chang et al. |
| 5,227,329 A | 7/1993 | Kobayashi et al. |
| 5,250,329 A | 10/1993 | Miracky et al. |
| 5,326,723 A | 7/1994 | Petro et al. |
| 5,391,394 A | 2/1995 | Hansen |
| 5,661,080 A | 8/1997 | Hwang et al. |

(Continued)

FOREIGN PATENT DOCUMENTS

WO WO01/27347 4/2001

OTHER PUBLICATIONS

Lee et al., PCT Search Report, Completed Oct. 15, 2004, PCT/US2004/006940, Int'l filing date May 3, 2004.

(Continued)

*Primary Examiner* — Charles Garber
*Assistant Examiner* — Reema Patel
(74) *Attorney, Agent, or Firm* — Weaver Austin Villeneuve & Sampson LLP

(57) ABSTRACT

Methods of forming low resistivity tungsten films with good uniformity and good adhesion to the underlying layer are provided. The methods involve forming a tungsten nucleation layer using a pulsed nucleation layer process at low temperature and then treating the deposited nucleation layer prior to depositing the bulk tungsten fill. The treatment operation lowers resistivity of the deposited tungsten film. In certain embodiments, the depositing the nucleation layer involves a boron-based chemistry in the absence of hydrogen. Also in certain embodiments, the treatment operations involve exposing the nucleation layer to alternating cycles of a reducing agent and a tungsten-containing precursor. The methods are useful for depositing films in high aspect ratio and/or narrow features. The films exhibit low resistivity at narrow line widths and excellent step coverage.

21 Claims, 8 Drawing Sheets

U.S. PATENT DOCUMENTS

| | | | |
|---|---|---|---|
| 5,726,096 | A | 3/1998 | Jung |
| 5,795,824 | A | 8/1998 | Hancock |
| 5,804,249 | A | 9/1998 | Sukharev et al. |
| 5,817,576 | A | 10/1998 | Tseng et al. |
| 5,926,720 | A | 7/1999 | Zhao et al. |
| 5,956,609 | A | 9/1999 | Lee et al. |
| 6,001,729 | A | 12/1999 | Shinriki et al. |
| 6,017,818 | A | 1/2000 | Lu |
| 6,037,263 | A | 3/2000 | Chang |
| 6,066,366 | A | 5/2000 | Berenbaum et al. |
| 6,099,904 | A | 8/2000 | Mak et al. |
| 6,107,200 | A | 8/2000 | Takagi et al. |
| 6,143,082 | A | 11/2000 | McInerney et al. |
| 6,174,812 | B1 | 1/2001 | Hsiung et al. |
| 6,206,967 | B1 | 3/2001 | Mak et al. |
| 6,245,654 | B1 | 6/2001 | Shih et al. |
| 6,265,312 | B1 | 7/2001 | Sidhwa et al. |
| 6,277,744 | B1 | 8/2001 | Yuan et al. |
| 6,294,468 | B1 | 9/2001 | Gould-Choquette et al. |
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,404,054 | B1 | 6/2002 | Oh et al. |
| 6,465,347 | B2 * | 10/2002 | Ishizuka et al. ............... 438/648 |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B2 | 8/2003 | Chen et al. |
| 6,635,965 | B1 | 10/2003 | Lee et al. |
| 6,706,625 | B1 | 3/2004 | Sudijono et al. |
| 6,720,261 | B1 | 4/2004 | Anderson et al. |
| 6,740,585 | B2 | 5/2004 | Yoon et al. |
| 6,797,340 | B2 | 9/2004 | Fang et al. |
| 6,844,258 | B1 | 1/2005 | Fair et al. |
| 6,861,356 | B2 | 3/2005 | Matsuse et al. |
| 6,902,763 | B1 | 6/2005 | Elers et al. |
| 6,905,543 | B1 * | 6/2005 | Fair et al. ........................ 117/89 |
| 6,908,848 | B2 | 6/2005 | Koo |
| 6,936,538 | B2 | 8/2005 | Byun |
| 6,939,804 | B2 | 9/2005 | Lai et al. |
| 6,962,873 | B1 | 11/2005 | Park |
| 7,005,372 | B2 | 2/2006 | Levy et al. |
| 7,141,494 | B2 | 11/2006 | Lee et al. |
| 7,157,798 | B1 | 1/2007 | Fair et al. |
| 7,211,144 | B2 * | 5/2007 | Lu et al. ........................ 117/101 |
| 7,262,125 | B2 | 8/2007 | Wongsenakhum et al. |
| 7,416,979 | B2 | 8/2008 | Yoon et al. |
| 7,429,402 | B2 | 9/2008 | Gandikota et al. |
| 7,589,017 | B2 | 9/2009 | Chan et al. |
| 7,655,567 | B1 | 2/2010 | Gao et al. |
| 7,691,749 | B2 | 4/2010 | Levy et al. |
| 7,754,604 | B2 | 7/2010 | Wongsenakhum et al. |
| 7,772,114 | B2 | 8/2010 | Chan et al. |
| 7,955,972 | B2 | 6/2011 | Chan et al. |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0090796 | A1 | 7/2002 | Desai et al. |
| 2002/0177316 | A1 | 11/2002 | Miller et al. |
| 2003/0059980 | A1 | 3/2003 | Chen et al. |
| 2003/0104126 | A1 | 6/2003 | Fang et al. |
| 2003/0127043 | A1 | 7/2003 | Lu et al. |
| 2004/0014315 | A1 | 1/2004 | Lai et al. |
| 2004/0044127 | A1 | 3/2004 | Okubo et al. |
| 2004/0142557 | A1 | 7/2004 | Levy et al. |
| 2004/0202786 | A1 * | 10/2004 | Wongsenakhum et al. ... 427/250 |
| 2004/0206267 | A1 | 10/2004 | Sambasivan et al. |
| 2005/0031786 | A1 | 2/2005 | Lee et al. |
| 2005/0059236 | A1 | 3/2005 | Nishida et al. |
| 2005/0136594 | A1 | 6/2005 | Kim |
| 2006/0094238 | A1 | 5/2006 | Levy et al. |
| 2007/0190780 | A1 | 8/2007 | Chung et al. |
| 2008/0124926 | A1 | 5/2008 | Chan et al. |
| 2008/0254623 | A1 | 10/2008 | Chan et al. |
| 2008/0280438 | A1 | 11/2008 | Lai et al. |
| 2009/0149022 | A1 | 6/2009 | Chan et al. |
| 2009/0163025 | A1 | 6/2009 | Humayun et al. |
| 2010/0035427 | A1 | 2/2010 | Chan et al. |
| 2010/0055904 | A1 | 3/2010 | Chen et al. |
| 2010/0159694 | A1 | 6/2010 | Chandrashekar et al. |
| 2010/0267230 | A1 | 10/2010 | Chandrashekar et al. |
| 2010/0267235 | A1 * | 10/2010 | Chen et al. .................... 438/680 |
| 2010/0273327 | A1 | 10/2010 | Chan et al. |

OTHER PUBLICATIONS

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

U.S. Office Action mailed Mar. 23, 2005, from U.S. Appl. No. 10/690,492.

U.S. Office Action mailed Nov. 23, 2005, from U.S. Appl. No. 10/984,126.

Chan et al., "Methods for Growing Low-Resistivity Tungsten Film", Novellus Systems, Inc., filed Nov. 1, 2005, U.S. Appl. No. 11/265,531, pp. 1-35.

Levy et al., "Deposition of Tungsten Nitride", Novellus Systems, Inc., filed Dec. 16, 2005, U.S. Appl. No. 11/305,368, pp. 1-39.

U.S. Office Action mailed Dec. 28, 2005, from U.S. Appl. No. 10/815,560.

U.S. Office Action mailed Dec. 30, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

U.S. Office Action mailed Apr. 17, 2006, from U.S. Appl. No. 10/815,560.

U.S. Office Action mailed May 17, 2006, from U.S. Appl. No. 10/984,126.

U.S. Office Action mailed Sep. 28, 2006, from U.S. Appl. No. 10/815,560.

Gao et al., "Methods for Improving Uniformity and Resistivity of Thin Tungsten Films," Novellus Systems, Inc, filed Jul. 24, 2007, U.S. Appl. No. 11/782,570, pp. 1-23.

Chan et al., "Methods for Growing Low-Resistivity Tungsten for High Aspect Ratio and Small Features," Novellus Systems, Inc., U.S. Appl. No. 12/030,645, filed Feb. 13, 2008.

Humayun et al., "Methods for Forming All Tungsten Contacts and Lines," Novellus Systems, Inc., U.S. Appl. No. 11/963,698, filed Dec. 21, 2007.

Chan et al., "Method for Improving Uniformity and Adhesion of Low Resistivity Tungsten Film," Novellus Systems, Inc., U.S. Appl. No. 11/951,236, filed Dec. 5, 2007.

Notice of Allowance and Fee Due mailed Mar. 12, 2003, from U.S. Appl. No. 09/975,074.

Allowed Claims from U.S. Appl. No. 09/975,074.

Notice of Allowance and Fee Due mailed Jul. 21, 2006, from U.S. Appl. No. 10/649,351.

Allowed Claims from U.S. Appl. No. 10/649,351.

Notice of Allowance and Fee Due mailed Oct. 7, 2004, from U.S. Appl. No. 10/435,010.

Allowed Claims from U.S. Appl. No. 10/435,010.

Notice of Allowance and Fee Due mailed Aug. 25, 2006, from U.S. Appl. No. 10/984,126.

Notice of Allowance and Fee Due mailed Sep. 14, 2005, from U.S. Appl. No. 10/690,492.

Allowed Claims from U.S. Appl. No. 10/690,492.

Notice of Allowance and Fee Due mailed Apr. 24, 2007, from U.S. Appl. No. 10/815,560.

Allowed Claims from U.S. Appl. No. 10/815,560.

U.S. Office Action mailed Jun. 27, 2008, from U.S. Appl. No. 11/305,368.

U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Office Action mailed Oct. 16, 2008, from U.S. Appl. No. 11/349,035.

U.S. Office Action mailed Sep. 29, 2008, from U.S. Appl. No. 11/782,570.

Ashtiani et al., "Ternary Tungsten-Containing Thin Films," Novellus Systems, Inc., U.S. Appl. No. 12/363,330, filed Jan. 30, 2009.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

U.S. Final Office Action mailed Apr. 28, 2009, from U.S. Appl. No. 11/782,570.

U.S. Office Action mailed Apr. 3, 2009, from U.S. Appl. No. 11/305,368.

U.S. Final Office Action mailed Feb. 26, 2009, from U.S. Appl. No. 11/265,531.

U.S. Notice of Allowance mailed May 4, 2009 from U.S. Appl. No. 11/265,531.

Allowed Claims from U.S. Appl. No. 11/265,531.

U.S. Final Office Action mail Feb. 25, 2009, from U.S. Appl. No. 11/349,035.

U.S. Office Action mailed Jun. 11, 2009, from U.S. Appl. No. 11/963,698.

U.S. Office Action mailed Jun. 4, 2009, from U.S. Appl. No. 11/349,035.

Ken K. Lai and H. Henry Lamb, Precursors for Organometallic Chemical Vapor Deposition of Tungsten Carbide Films, 1995, Chemistry Material, pp. 2284-2292.

U.S. Office Action mailed Jun. 24, 2009 from U.S. Appl. No. 12/030,645.

U.S. Office Action mailed Aug. 5, 2009, from U.S. Appl. No. 11/951,236.

Ashtiani et al., "Ternary Tungsten-Containing Resistive Thin Films," Novellus Systems, Inc., U.S. Appl. No. 12/363,330, filed Jan. 30, 2009.

U.S. Office Action mailed Oct. 21, 2009 from U.S. Appl. No. 12/202,126.

U.S. Notice of Allowance mailed Nov. 17, 2009 from U.S. Appl. No. 11/305,368.

Allowed Claims from U.S. Appl. No. 11/305,368.

U.S. Final Office Action mailed Nov. 20, 2009 from U.S. Appl. No. 11/349,035.

U.S. Final Office Action mailed Dec. 9, 2009 from U.S. Appl. No. 11/963,698.

U.S. Notice of Allowance mailed Sep. 17, 2009 from U.S. Appl. No. 11/782,570.

Lee et al., PCT Search Report, Completed Oct. 15, 2004, PCT/US2004/006940, Int'l filed May 3, 2004.

Allowed Claims from U.S. Appl. No. 11/782,570.

Chan et al., "Methods for Growing Low-Resistivity Tungsten Filml", Novellus Systems Inc., U.S. Appl. No. 12/538,770, filed Aug. 10, 2009.

U.S. Final Office Action mailed Jan. 13, 2010 from U.S. Appl. No. 12/030,645.

Gao et al., "Method for Improving Adhesion of Low Resistivity Tungsten/Tungsten Nitride Layers," Novellus Systems, Inc., U.S. Appl. No. 12/556,490, filed Sep. 9, 2009.

Gao et al., "Methods for Improving Uniformity and Resistivity of Thin Tungsten Films," Novellus Systems, Inc, filed Dec. 11, 2009, U.S. Appl. No. 12/636,616.

U.S. Office Action mailed Jan. 26, 2010 from U.S. Appl. No. 11/951,236.

U.S. Notice of Allowance mailed Mar. 2, 2010 from U.S. Appl. No. 11/349,035.

Allowed Claims from U.S. Appl. No. 11/349,035.

Danek, et al, "Tungsten Barrier and Seed for Copper Filled TSV," Novellus Systems, Inc., filed Mar. 12, 2010, U.S. Appl. No. 12/723,532.

Chandrashekar, et al., "Method for Forming Tungsten Contacts and Interconnects with Small Critical Dimensions," Novellus Systems, Inc, filed Apr. 6, 2010, U.S. Appl. No. 12/755,248.

Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.

U.S. Notice of Allowance and Allowed Claims mailed Apr. 6, 2010 from U.S. Appl. No. 11/951,236.

U.S. Final Office Action mailed May 7, 2010 from U.S. Appl. No. 12/202,126.

Chan et al., "Method for Improving Uniformity and Adhesion of Low Resistivity Tungsten Film," Novellus Systems, Inc., U.S. Appl. No. 12/829,119, filed Jul. 1, 2010.

U.S. Office Action mailed Jun. 11, 2010 from U.S. Appl. No. 11/963,698.

U.S. Final Office Action mailed Jul. 23, 2010 from U.S. Appl. No. 12/030,645.

U.S. Office Action mailed Jul. 26, 2010 from U.S. Appl. No. 12/202,126.

International Search Report and Written Opinion mailed Apr. 12, 2010 from Application No. PCT/US2009/055349.

Chan et al., "Method for Improving Uniformity and Adhesion of Low Resistivity Tungsten Film," Novellus Systems, Inc., U.S. Appl. No. 12/829,119, filed Jul. 1, 2010.

Hoover, Cynthia, "Enabling Materials for Contact Metallization," Praxair Electronic Materials R&D, Jul. 2007, pp. 1-16.

Purchase of ethylcyclopentadienyl)dicarbonylnitrosyltungsten from Praxair in Oct. 2006.

U.S. Office Action for U.S. Appl. No. 12/538,770 mailed Nov. 23, 2010.

U.S. Final Office Action for U.S. Appl. No. 11/963,698 mailed Dec. 30, 2010.

U.S. Office Action for U.S. Appl. No. 12/636,616 mailed Jan. 25, 2011.

U.S. Final Office Action mailed Feb. 7, 2011 from U.S. Appl. No. 12/202,126.

Notice of Allowance and Fee Due mailed Jan. 24, 2011, from U.S. Appl. No. 12/030,645.

Allowed Claims from U.S. Appl. No. 12/030,645 as of Jan. 24, 2011.
Chan et al., "Methods for Growing Low-Resistivity Tungsten for High Aspect Ratio and Small Features," Novellus Systems, Inc., U.S. Appl. No. 13/095,734, filed Apr. 27, 2011.
U.S. Office Action for U.S. Appl. No. 12/755,248 mailed May 13, 2011.
U.S. Office Action for U.S. Appl. No. 12/556,490 mailed Jun. 14, 2011.
U.S. Final Office Action for U.S. Appl. No. 12/636,616 mailed Jun. 15, 2011.
Notice of Allowance for U.S. Appl. No. 12/538,770 mailed Jun. 30, 2011.
Allowed Claims as of Jun. 30, 2011, for U.S. Appl. No. 12/538,770.
U.S. Office Action for U.S. Appl. No. 12/829,119, mailed Jun. 30, 2011.
Notice of Allowance mailed Jul. 25, 2011, for U.S. Appl. No. 12/363,330.
Allowed Claims as of Jul. 25, 2011, for U.S. Appl. No. 12/363,330.

* cited by examiner

METHOD FOR DEPOSITING THIN TUNGSTEN FILM WITH LOW RESISTIVITY AND ROBUST MICRO-ADHESION CHARACTERISTICS

CROSS-REFERENCE TO RELATED APPLICATION

This application claims benefit under 35 U.S.C. 119(e) of U.S. Provisional Application No. 61/061,078, filed Jun. 12, 2008. This application is incorporated by reference herein in its entireties and for all purposes.

FIELD OF INVENTION

This invention relates to methods for preparing tungsten films. Embodiments of the invention are useful for integrated circuit applications that require thin tungsten films having low electrical resistivity with good uniformity and good adhesion.

BACKGROUND

The deposition of tungsten films using chemical vapor deposition (CVD) techniques is an integral part of many semiconductor fabrication processes. Tungsten films may be used as low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$) on the growing tungsten layer. The tungsten bulk layer is generally deposited more rapidly than the nucleation layer, but cannot be produced easily and reliably without first forming the nucleation layer.

SUMMARY OF INVENTION

Methods of forming low resistivity tungsten films with good uniformity and good adhesion to the underlying layer are provided. The methods involve forming a tungsten nucleation layer using a pulsed nucleation layer process at low temperature and then treating the deposited nucleation layer prior to depositing the bulk tungsten fill. The treatment operation lowers resistivity of the deposited tungsten film. In certain embodiments, depositing the nucleation layer involves a boron-based chemistry in the absence of hydrogen. Also in certain embodiments, the treatment operations involve exposing the nucleation layer to alternating cycles of a reducing agent and a tungsten-containing precursor. The methods are useful for depositing films in high aspect ratio and/or narrow features. The films exhibit low resistivity at narrow line widths and excellent step coverage.

These and other features and advantages of the invention will be described in more detail below with reference to the associated drawings.

BRIEF DESCRIPTION OF THE DRAWINGS

The following detailed description can be more fully understood when considered in conjunction with the drawings in which.

DETAILED DESCRIPTION

Introduction

Figure 1:
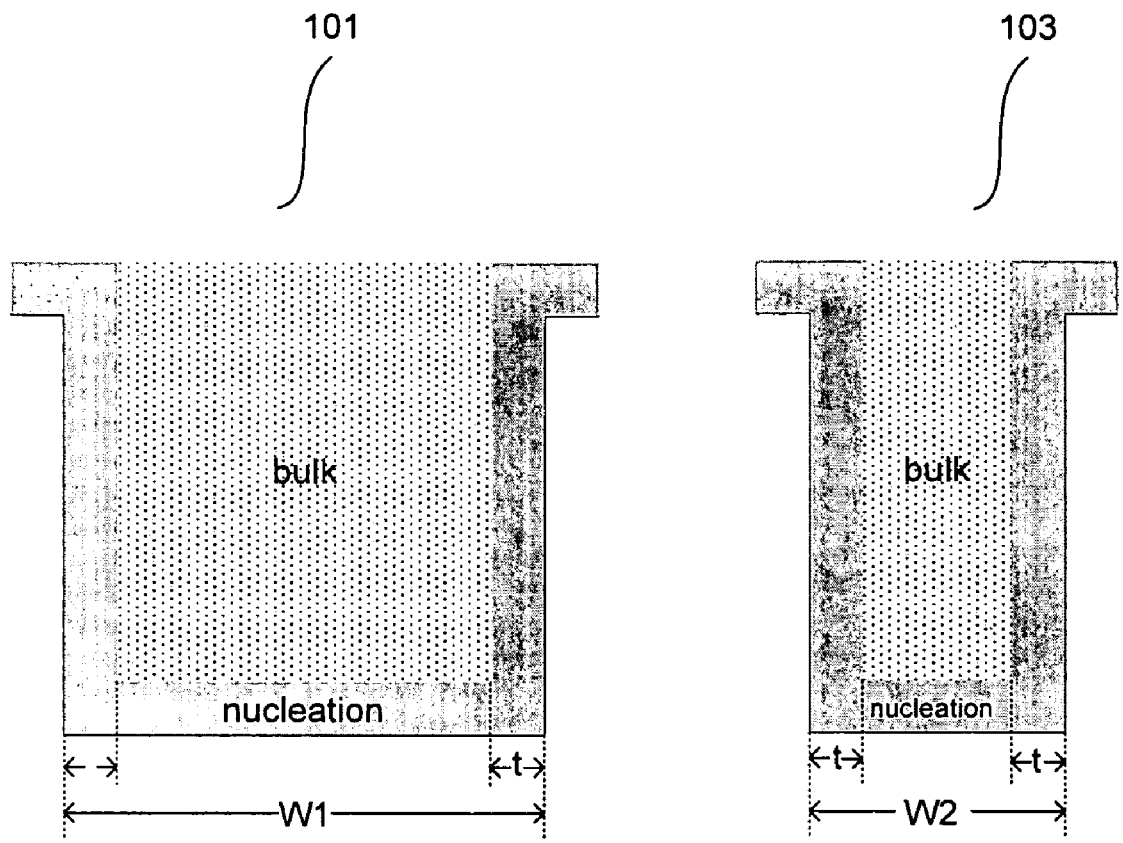
FIG. 1 shows simple cross-sectional diagrams of tungsten deposition in low and high aspect ratio features.

In the following description, numerous specific details are set forth in order to provide a thorough understanding of the present invention, which pertains to forming thin tungsten films. The methods involve pulsed nucleation layer (PNL) deposition techniques, which will be described in detail below. Modifications, adaptations or variations of specific methods and or structures shown and discussed herein will be apparent to those skilled in the art and are within the scope of this invention.

In a PNL technique, pulses of the reducing agent, purge gases, and tungsten-containing precursors are sequentially injected into and purged from the reaction chamber. The process is repeated in a cyclical fashion until the desired thickness is achieved. PNL is similar to atomic layer deposition techniques reported in the literature. PNL is generally distinguished from atomic layer deposition (ALD) by its higher operating pressure range (greater than 1 Torr) and its higher growth rate per cycle (greater than 1 monolayer film growth per cycle). In the context of this invention, PNL broadly embodies any cyclical process of sequentially adding reactants for reaction on a semiconductor substrate. Thus, the concept embodies techniques conventionally referred to as ALD. Additional discussion regarding PNL type processes can be found in U.S. Pat. Nos. 6,635,965, 6,844,258, 7,005,372 and 7,141,494 as well as in U.S. patent applications Ser. No. 11/265,531, incorporated herein by reference.

The present invention involves forming a tungsten film by way of a tungsten nucleation layer. In general, a nucleation layer is a thin conformal layer which serves to facilitate the subsequent formation of a bulk material thereon. The nucleation layer may be formed using one or more PNL cycles. The methods described herein provide nucleation layers that are very thin yet sufficient for good plugfill, have low resistivity and exhibit good micro-adhesion. The methods are especially useful for depositing tungsten in high aspect ratio and small features.

As features become smaller, the tungsten (W) contact or line resistance increases due to scattering effects in the thinner W film. While efficient tungsten deposition processes require tungsten nucleation layers, these layers typically have higher electrical resistivities than the bulk tungsten layers. Thus, to keep the electrical resistance of the overall tungsten film (tungsten nucleation layer and bulk tungsten) low, the tungsten nucleation layer should be kept as thin as possible. A simplified equation describing the total resistance of a tungsten layer is:

$$R_{total} = R_{bulk} + R_{nucleation} = \rho_{bulk}(L_{bulk}/A) + \rho_{nucleation}(L_{nucleation}/A)$$

This is shown in the above simplified equation of total resistance, $R_{total}$, where $\rho$ is the resistivity of the material, L is the length of the layer in the direction of the current flow and A is the cross-sectional area perpendicular to current flow. (It should be noted that certain contributions to the total resistance are neglected in the above equation for the sake of explanation). Resistivity is an intrinsic property of a material and a measurement of a material's resistance to the movement of charge through the material. The resistivity of a material affects the electrical operation of an integrated circuit. Low resistivity tungsten films minimize power losses and overheating in integrated circuit designs. Because the $\rho_{nucleation} > \rho_{bulk}$, the thickness of the nucleation layer should be minimized to keep the total resistance as low as possible. On the other hand, the tungsten nucleation should be sufficiently thick to fully cover the underlying substrate to support high quality bulk deposition. To achieve an optimal thickness, the tungsten nucleation layer may be formed in one or more PNL deposition cycles.

For narrow width and/or high aspect ratio and thin features, obtaining thin nucleation layers is even more critical. FIG. 1 shows a relatively low aspect ratio feature 101 is shown in comparison to a relatively high aspect ratio feature 103. (These features are not drawn to scale but to illustrate the qualitative difference between nucleation layers in high and low aspect ratio features). Here, the thickness t is the same for both features, but the width W2 of feature 103 is much less than width W1 of feature 101 and the nucleation layer takes up a significantly higher percentage of the total volume of the feature. As a result, the nucleation layer has a much high relative contribution to the overall resistance of the feature. Thus, it becomes important to reduce the nucleation layer thickness (for example from a 50 A film to <30 A) for small features (for example a feature having a 10:1 aspect ratio or 400 A opening) in order to reduce the overall stack resistivity.

In addition to providing tungsten films having low resistivity, the methods described herein provide films having good uniformity and adhesion to the underlying material. In certain embodiments, the methods provide good micro-adhesion as well as macroscopic adhesion. Macrosopic adhesion may be measured by a scribe/tape test. In a scribe/tape test, the tungsten film is scribed with a diamond cutter, tape is placed over the scribed area, and then the tape is pulled off. "Pass" for adhesion indicates that the tungsten film remained on the titanium nitride barrier layer after a scribe/tape test, whereas "Fail" indicates that the tape removed portions of the tungsten film. Poor micro-adhesion results in micron-scale peeling of the deposited tungsten film. A film may have acceptable macro-scale adhesion, remaining on the underlying layer in a scribe/test, while still exhibiting micro-peeling.

Figure 2:
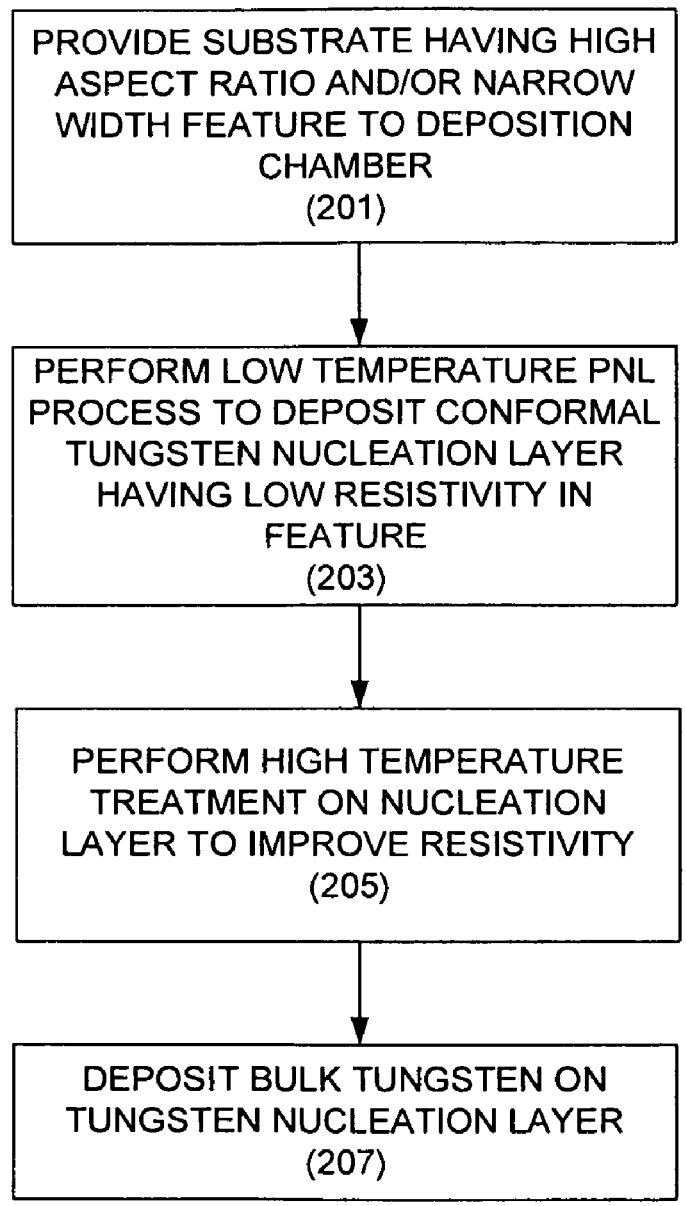
FIG. 2 is a process flow sheet showing relevant operations of methods according to various embodiments of the present invention.

The methods involve forming a tungsten nucleation layer in a feature using a pulsed nucleation layer process at low temperature and then treating the deposited nucleation layer prior to depositing the bulk tungsten fill. FIG. 2 presents a process flow sheet showing an overview of operations according to certain embodiments. Initially, a substrate is provided and positioned in a reaction chamber as indicated by a process block 201. As mentioned previously, in many embodiments the substrate is a partially fabricated electronic device (e.g., a partially fabricated integrated circuit). Specific applications of the invention are described further below. The substrate contains a feature that has a high aspect ratio and/or narrow width. According to various embodiments, high aspect ratios range from 5:1-30:1. In certain embodiments, the aspect ratio is at least 10:1 or 20:1. Features having widths as narrow as 300-400 Angstroms also benefit from this process. In some cases, both the feature has both a high aspect ratio and a narrow width, but features having only one of these geometric characteristics benefit from the processes. For example, in one embodiment, a low resistivity tungsten layer is deposited in a feature having a width around 500 Angstrom and aspect ratio of about 30:1. In certain embodiments, the methods may also be advantageously used to deposit low resistivity tungsten film on planar surfaces and surfaces having lower aspect ratio features and wider features.

Next, as indicated by a process block 203, a low temperature pulsed nucleation layer (PNL) process is performed to deposit a tungsten nucleation layer. Depositing tungsten nucleation layer using a PNL process involves exposing the substrate to alternating pulses of a reducing agent and a tungsten-containing precursor, such as $WF_6$. Low temperature tungsten nucleation layer processes to deposit conformal nucleation layers are described in U.S. patent application Ser. No. 11/265,531, filed Nov. 1, 2005, incorporated by reference herein in its entirety and for all purposes. Substrate temperature is low—below about 350 C, for example between about 250 and 350 C or 250 and 325 C. In certain embodiments, the temperature is around 300 C. Above-referenced application Ser. No. 11/265,531 describes sequences of reducing agent/tungsten-containing precursor pulses that result may be used to deposit low resistivity film. According to various embodiments, boron-containing (e.g., diborane) and non-boron-containing (e.g., silane) reducing agents are used to deposit the nucleation layers. Also, in certain embodiments, nucleation layer deposition includes one or more high temperature (e.g., 395° C.) PNL cycles after the low temperature cycles. In certain embodiments, methods for depositing tungsten nucleation layers in very small/high aspect ratio features as described in U.S. patent application Ser. No. 12/030,645, filed Feb. 13, 2008, incorporated by reference herein in its entirety and for all purposes, are used to deposit the nucleation layer. These methods involve using PNL cycles of a boron-containing reducing agent and a tungsten-containing precursor with no hydrogen in the background to deposit very thin tungsten nucleation layers (e.g., about 12 Angstroms) in these features that have good step coverage. In certain embodiments following these methods, diborane or (another borane or boron-containing reducing agent) is the only reducing agent used during deposition of the nucleation layer.

Figure 3A:
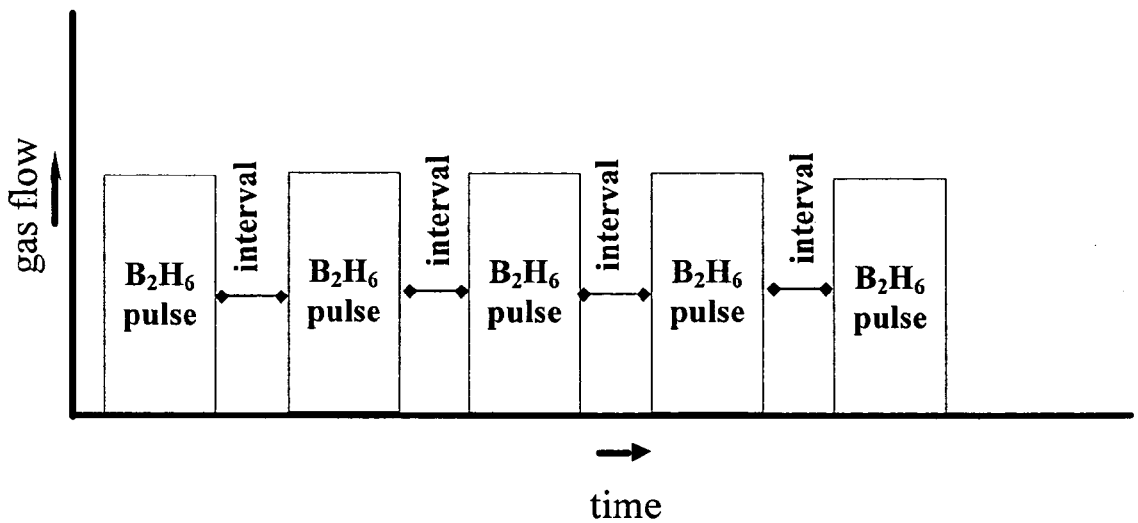
FIGS. 3a and 3b are graphs representing reducing agent pulses and interval times of the low resistivity treatment operations according to various embodiments of the invention.
Figure 3B:
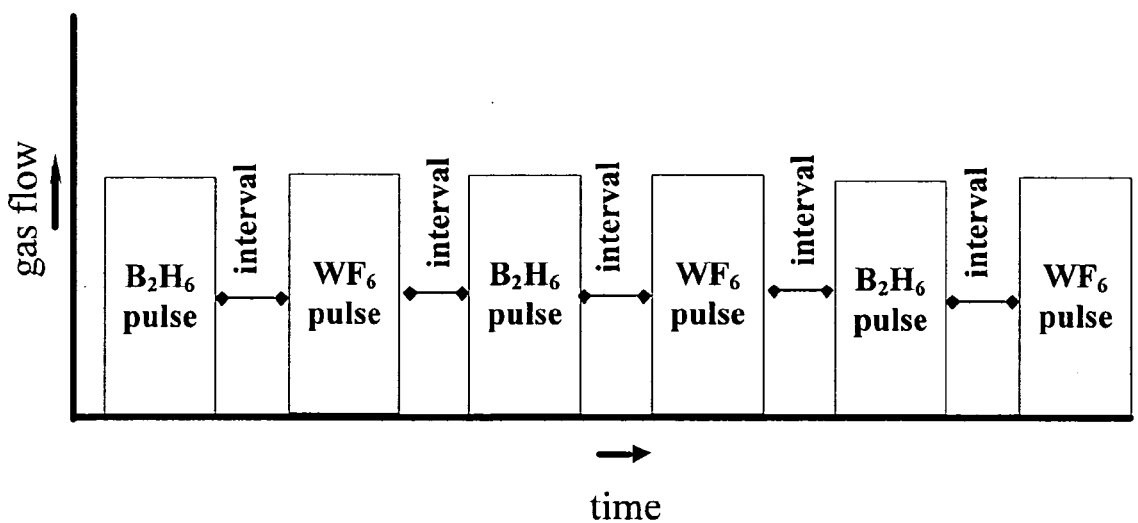

Referring back to FIG. 2, the next operation 205 involves a higher temperature treatment process to lower resistivity. FIGS. 3a and 3b are graphs showing examples of treatments that may be performed. FIG. 3a shows an example of a treatment process such as described in such as that described in U.S. patent application Ser. No. 11/951,236, filed Dec. 5, 2007, incorporated by reference herein in its entirety and for all purposes. The treatment process described therein involves exposing the deposited nucleation layer to multiple pulses of a reducing agent (without intervening pulses of another reactive compound). In the figure, diborane is depicted as the reducing agent, though other reducing agents may be used. The treatment lowers resistivity, while providing good adhesion and resistance non-uniformity. Notably, using multiple reducing agent pulses is shown to provide significantly improved resistivity and uniformity than using a single pulse—even with the same overall exposure time. However, too many pulses lead to poor adhesion of the eventual tungsten film to the underlying layer. As discussed in the Ser. No. 11/951,236 application, an optimal number of pulses, e.g., between 2-8, is used to obtain low resistivity, low non-uniformity and acceptable adhesion.

FIG. 3b shows another example of a treatment process in which the substrate having the nucleation layer deposited thereon is exposed to multiple cycles of alternating reducing agent and a tungsten-containing precursor pulses. Diborane, $B_2H_6$, and tungsten hexafluoride, $WF_6$, are shown as the reducing agent and tungsten-containing precursor, respectively, though certain embodiments may use other compounds.

Alternating pulses of a reducing agent and tungsten-containing precursor are also used to deposit the tungsten nucleation layer, but in the treatment operation, typically substantially no tungsten is deposited. It has been found that in certain cases, using such a treatment operation provides film with fewer defects than the multiple pulse treatment show illustrated in FIG. 3a. In particular, alternating $B_2H_6$ and $WF_6$ has been shown to substantially reduce or eliminate instances of micro-peeling—micron-scale, localized areas of peeling of the tungsten bulk layer from the underlying surface. Without being bound by a particular theory, it is believed that is because the $WF_6$ or other tungsten precursor scavenges residual reducing agent on the film.

As indicated in FIG. 2, the treatment process is performed at a higher temperature than the nucleation layer deposition. Temperatures range from 375 C to 415 C, e.g., about 395 C. Transitioning from nucleation layer deposition to this treatment operation may involve heating the substrate to between about 350 C and 415 C, or in certain embodiments to about 375 C to 415 C and allowing it to stabilize before exposing the nucleation layer to a plurality of reducing agent or reducing agent/tungsten-containing precursor pulses in process. As indicated in certain embodiments the substrate temperature is about 395 C. Lower temperatures would require longer pulse times to achieve equivalent treatment effect.

Examples of gas flow rates of the reducing agent (and tungsten-containing precursor if used) during a pulse is between about 100 to 500 sccm. The pulse time may vary from between about 0.5 to 5 seconds, e.g., between about 1 to 2 seconds. The interval time between each pulse typically varies between about 2 to 5 seconds. When a tungsten-containing precursor is used, as depicted in FIG. 3b, the pulse time should be short enough to ensure that no or substantially no tungsten deposits. (In certain embodiments, some small amount of tungsten, e.g., about or less than an atomic layer may be deposited during the treatment). In certain embodiments, the reducing agent and tungsten-containing precursor pulses may be as short as less than 1 second. In one example $B_2H_6$ is pulsed for 1 second, followed by a 1 second purge, followed by a $WF_6$ pulse of 1 second, followed by a 2.5 second purge. This cycle is then repeated four times.

For these operating conditions, the number of reducing agent pulses (as in FIG. 3a) and or reducing agent/tungsten precursor cycles (as in FIG. 3b) is typically between 2 and 8. Five pulses or cycles are used in particular embodiments. Chamber pressure can vary broadly during the multi-pulse reducing agent treatment, between about 2 and 100 Torr, and more preferably between about 20 and 40 Torr. These parameters are based on 300 mm wafers and may need to be adjusted depending on the wafer size, particular processing equipment, particular reducing agent used, etc.

It has been found that depending on the pulse time, pulse dose, and interval time, there exists an optimum number of pulses to use to obtain the desired tungsten film properties. If too few pulses are used, the resistivity and sheet resistance uniformity of the tungsten film are poor. If too many pulses are used, the resistivity and uniformity of the tungsten film are good, but adhesion is poor and micro-peeling increases. In many embodiments, the optimum is between 2-8, though the optimum number of pulses depends on the operating conditions used. A significantly higher number of pulses may be used for significantly different processing conditions. Gas flow rate and/or pulse time may be identical or may be varied from pulse to pulse.

Returning to FIG. 2, once the tungsten nucleation layer is treated, a bulk tungsten layer is deposited in the feature in a process operation 207. In many embodiments the bulk tungsten is deposited using a CVD process. CVD processes rapidly produce low resistivity films. Any suitable CVD process may be used with any suitable tungsten-containing precursor. In some embodiments the same tungsten-containing precursor used in the PNL processes for forming the tungsten nucleation layer is use—typically one of $WF_6$, $WCl_6$ and $W(CO)_6$. Frequently, the CVD process is performed using a mixture of molecular hydrogen and one or more of these precursors. In other embodiments, the CVD process may employ a tungsten precursor together with silane or a mixture of hydrogen and silane or a mixture of hydrogen and borane (such as diborane). Non-CVD process can also be employed to form the bulk layer. These include ALD/PNL and physical vapor deposition (PVD).

The bulk tungsten can be deposited to any thickness. Tungsten interconnect lines for integrated circuit applications may have a total thickness (tungsten nucleation layer and bulk tungsten) of between about 20 and 1,000 Angstroms. For a typical bit line, the total tungsten film thickness typically is no more than about 600 Angstroms. The resulting tungsten film will preferably have a resistivity of no greater than about 30 μΩ-cm. Resistivity depends on how much of the total thickness is due to the nucleation layer. The resistivity for 600 A film (nucleation+CVD tungsten) deposited using the process described above with reference to FIG. 2, the resistivity for a 600 A film is less than about 14 μΩ-cm, and in certain cases less than about 11 μΩ-cm. Moreover, the film exhibits lower resistivity than film that is not treated. After the tungsten film is deposited to a sufficient thickness, the process flow of FIG. 1 is complete.

Figure 4A:
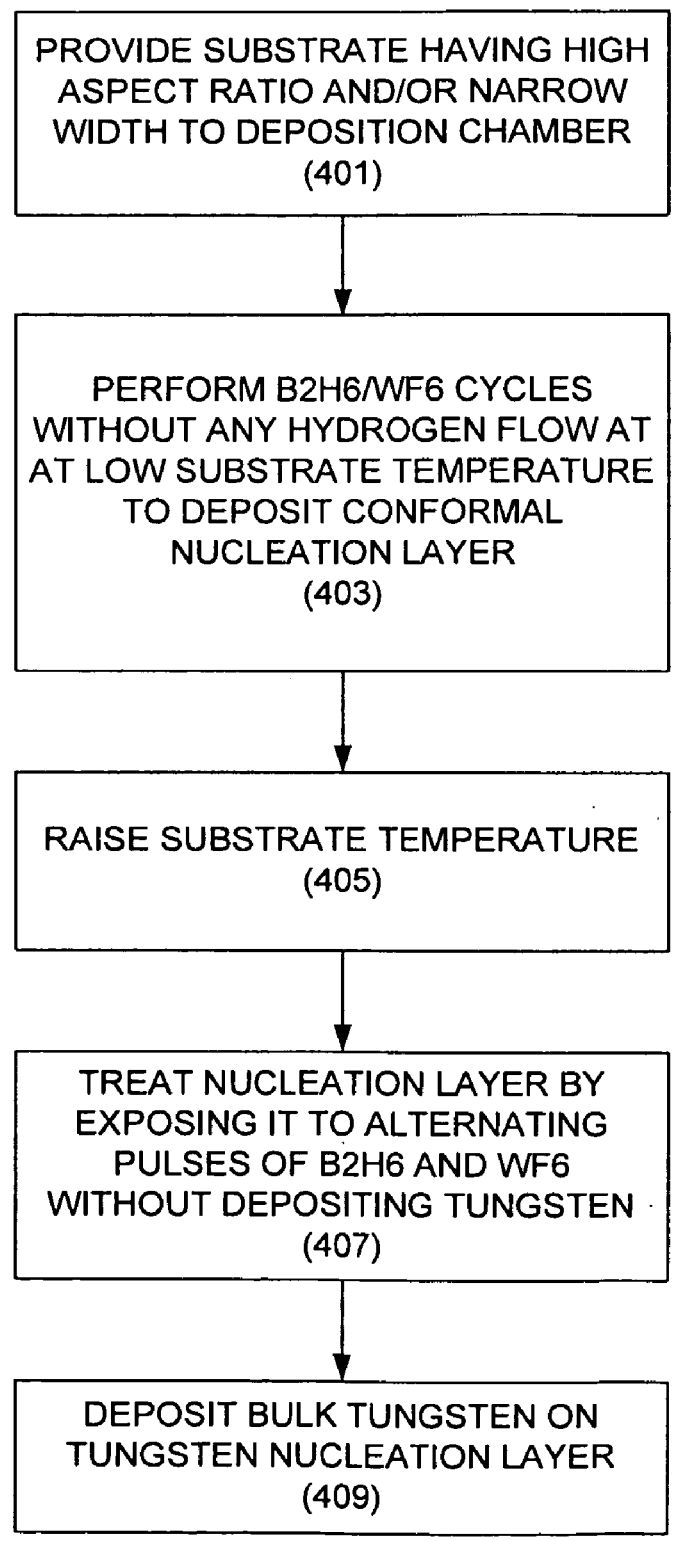
FIGS. 4a and 4b are process flow sheets showing relevant operations of methods according to various embodiments of the present invention.

FIG. 4a is a process flow sheet showing a particular embodiment of the process depicted in FIG. 2. Here, as in FIG. 2, a substrate having a high aspect ratio and/or a narrow width is provided to a deposition chamber in an operation 401. A low temperature PNL process is then performed by exposing the substrate to alternating pulses of $B_2H_6$ and $WF_6$ in an operation 403. No hydrogen is present during deposition of this nucleation layer. In one example, $B_2H_6$ is pulsed for 2 seconds, followed by a 3 second purge, followed by a 0.5 second $WF_6$ pulse and a 3 second purge. This repeated as necessary to deposit the nucleation layer conformally in the feature to the desired thickness. Using this low temperature PNL process, the nucleation layer may have thickness of less than about 15 Angstroms, e.g., 12 Angstroms, and still be sufficient for good plugfill. Substrate temperature is then raised, e.g., from about 300° C. to about 395° C., for the low resistivity treatment in an operation 407. Other temperatures may be used; in certain embodiments, the temperature is raised at least 50° C. or at least 75° C. The deposited nucleation layer is then exposed to alternating $B_2H_6$ and $WF_6$ pulses in the presence of hydrogen in an operation 409. As described above, there is typically no measurable amount of tungsten deposited in this operation. The effect of this operation to lower resistivity of the tungsten plug. In certain embodiments, between 2 and 8 cycles, e.g., 5 cycles are performed. After the multiple pulse treatment, a bulk tungsten layer is then deposited in an operation 409. In multi-station deposition apparatuses, the nucleation layer may be deposited in a first station, with the low resistivity treatment performed in one or more additional stations.

As discussed further below in the experimental section, processes according to the embodiment shown in FIG. 4a, i.e., depositing a PNL nucleation layer without hydrogen running in the background and using multiple cycles of $B_2H_6$/ $WF_6$ in the treatment operation, result in lower resistivity, good adhesion and no or reduced micro-peeling, as compared to processes that deposit the nucleation layer in the presence of hydrogen and/or use reducing agent-only treatment operations.

Figure 6:
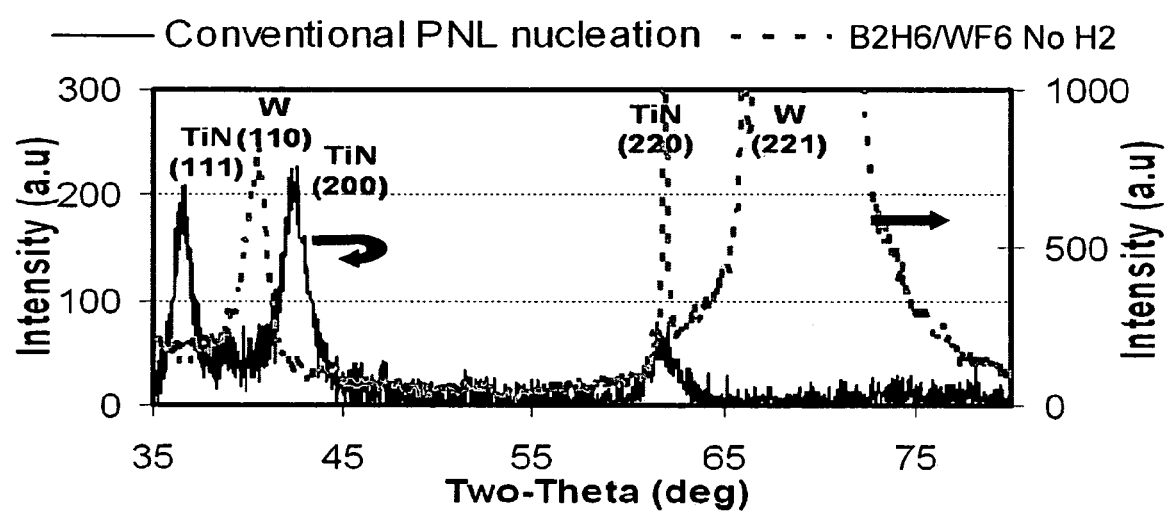
FIG. 6 shows XRD spectra of a conventional nucleation layer and a layer formed according to an embodiment of the invention.

Using a boron-based nucleation chemistry at relatively low temperature (e.g., 300° C.) in the absence of hydrogen and a boron-based resistivity treatment at a higher temperature, as is done in certain embodiments of the methods described in FIGS. 2-4 results in films having excellent step coverage and low resistivity. FIG. 6 shows XRD spectra for a conventional nucleation process (using silane as a reducing agent in the presence of hydrogen) and diborane-based nucleation layer formed in the absence of hydrogen. The conventional film shows peaks corresponding to W crystallinity, while the diborane-based process appears to be amorphous W. Without being bound to a particular theory, it is believed that the amorphous nature of the film promotes conformal tungsten fill inside a trench or other feature. The absence of grain boundaries also protects the underlying barrier layer from fluorine attack during a subsequent aggressive CVD reaction. As a result, the nucleation layer itself has a lower resistivity than nucleation layers deposited using conventional PNL processes. Moreover, using pulses of $B_2H_6$ or pulses of $B_2H_6$/ $WF_6$ to treat the nucleation film promotes larger W grain growth during CVD fill.

Figure 4B:
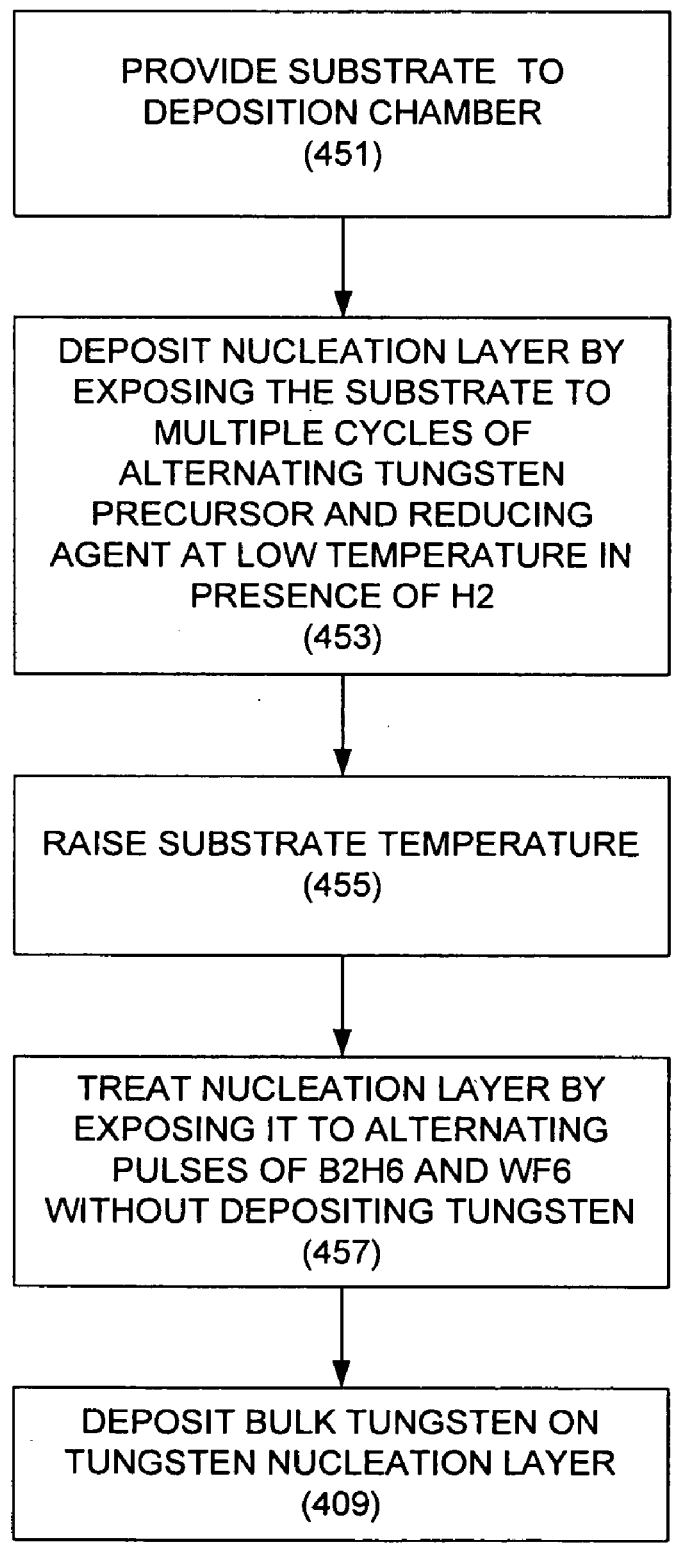

FIG. 4b is a process flow sheet showing operations for another embodiment. A substrate is provided to a deposition chamber in an operation 451. According to various embodiments, the substrate may have at least on high aspect ratio/ narrow feature, though as in those embodiments, the methods are not limited to such substrates. A low temperature PNL process is then performed to deposit a tungsten nucleation layer in an operation 453. Unlike the process described in FIG. 4a, hydrogen is run in the background. Depositing the nucleation layer typically involves multiples cycles of alternating pulses of $WF_6$ and one or more reducing agent. In one embodiment, depositing the nucleation layer involves a single cycle of $B_2H_6$ and $WF_6$ alternating pulse followed by multiple cycles $SiH_4$ and $WF_6$. Substrate temperature is then raised, e.g., from about 300° C. to about 395° C., for the low resistivity treatment in an operation 457. Other temperatures may be used; in certain embodiments, the temperature is raised at least 50° C. or at least 75° C. The deposited nucleation layer is then exposed to alternating $B_2H_6$ and $WF_6$ pulses in the presence of hydrogen in an operation 459. As described above, there is typically no measurable amount of tungsten deposited in this operation. The effect of this operation to lower resistivity of the tungsten plug. In certain embodiments, between 2 and 8 cycles, e.g., 5 cycles are performed. After the multiple pulse treatment, a bulk tungsten layer is then deposited in an operation 459. In multi-station deposition apparatuses, the nucleation layer may be deposited in a first station, with the low resistivity treatment performed in one or more additional stations.

As described further below with reference to Example 7, the process described in FIG. 4b has been shown to provide lower resistivity as compared to a process that does not use multi-pulse treatment. Moreover, adhesion is improved over processes that use a multi-pulse treatment of a boron-containing reducing agent with no intervening tungsten precursor pulses; those processes lower resistivity, but may have poor adhesion, e.g., as evidenced by peeling. As with the process in FIG. 4a, the multi-pulse treatment described in operation 459 significantly reduces the possibility of tungsten micro-peeling that may occur where multiple pulses of a boron-containing agent are used without an intervening tungsten precursor pulse (as in FIG. 3a) to lower resistivity. As indicated above, without being bound by a particular theory, it is believed that the introduction of the $WF_6$ pulses between $B_2H_6$ pulses helps scavenge unreacted $B_2H_6$, which otherwise promotes the onset of micropeeling, from the film surface. In one example of the multi-pulse boron-containing compound/tungsten precursor treatment operations described above, $B_2H_6$ is pulsed for 1 second, followed by a 1 second purge, followed by a 1 second $WF_6$ pulse, followed by a 2.5 second purge. The process is then repeated four times. In a particular example, the $B_2H_6$ flow rate is 300 sccm and the $WF_6$ flow rate is 100 sccm.

According to various embodiments, the process may be used to provide tungsten films having a resistivity at 600 Angstroms of no more than about 14 $\mu\Omega$-cm or in certain embodiments, no more than about 11 $\mu\Omega$-cm. The films may also have a resistance non-uniformity of less than about 5%.

EXPERIMENTAL

The following examples are provided to further illustrate aspects and advantages of the present invention. These examples are provided to exemplify and more clearly illustrate aspects of the present invention and are in no way intended to be limiting.

Example 1

A W nucleation layer was formed in features having an AR of 8.5:1 and a top opening was 0.14 μm at 300° C. using tungsten nucleation layer deposition sequences shown in the table below. Nucleation layers of about 42 Å for process A, 25 Å for process C and 35 Å for process B were deposited. Treatment operations were then performed using sequences shown below at 395° C. (Note that for process A, the 'treatment' involved a B2H6/WF6 cycle having longer pulse duration; tungsten film was deposited during this step.) Note that process is in accordance with the embodiments depicted in FIG. 4a. A bulk tungsten layer was then deposited on each nucleation layer. Resistivity at 600 Angstroms and resistance non-uniformity at 3 mm edge exclusion were measured. The films were also examined for areas of micro-peeling. Process conditions and results are shown below in Table 1

TABLE 1

| Process | Nucleation Layer Deposition Sequence | Treatment Sequence | Resistivity at 600 Angstroms ($\mu\Omega$-cm) | 4 mm EE Rs % NU | Micro-peeling observed? |
| --- | --- | --- | --- | --- | --- |
| A | 1 B2H6/WF6 cycle + 4 | 1 B2H6/ | 13 | about 9% | No |

TABLE 1-continued

| Process | Nucleation Layer Deposition Sequence | Treatment Sequence | Resistivity at 600 Angstroms (μΩ-cm) | 4 mm EE Rs % NU | Micro-peeling observed? |
|---|---|---|---|---|---|
| | SH4/WF6 cycles (in presence of H2) | WF6 cycle - with tungsten deposition | | | |
| B | 1 B2H6/WF6 cycle + 3 SH4/WF6 cycles (in presence of H2) | 5 B2H6 pulse | 10 | about 3% | Yes |
| C | 5 B2H6/WF6 cycles (no H2) | 5 B2H6/WF6 - no tungsten deposition | 10.7 | about 3% | No |

Processes B and C, which have multiple pulse treatment operations, provide improved resistivity over process A. Process C, which uses no hydrogen in the tungsten nucleation layer deposition and uses WF6 pulses in the treatment operation provides the resistivity benefits seen with process B, but without any micro-peeling.

Example 2

A W nucleation layer was formed on semiconductor substrates (planar) at 300° C. using tungsten nucleation layer deposition sequences shown in the table below. Nucleation layer thicknesses of about 35 Å for Process D, about 25 Å for processes E and F were deposited. Process D used a single B2H6/WF6 cycles followed by three SiH4/WF6 cycles in the presence of H2; processes E and F used a low resistivity tungsten deposition process without any hydrogen. Low resistivity treatment operations were then performed using 5 cycles of the sequences shown below at 395° C. Process D used pulses of B2H6 (no intervening pulses); processes E and F both used alternating B2H6 and WF6 pulses. Processes E and F were performed in accordance with the embodiments depicted in FIG. 4a. A bulk tungsten layer was then deposited on each nucleation layer. Resistivity at 600 Angstroms and resistance non-uniformity at 4 mm edge exclusion were measured. For each process, conditions were optimized to minimize micro-peeling and defects. The magnitude of defects for each process was the same. Process conditions and results are shown below in Table 2:

TABLE 2

| Process | Nucleation Layer Deposition Sequence | Treatment - 5 cycles | | 4 mm EE Rs % NU | Resistivity at 600 Å (μΩ-cm) |
|---|---|---|---|---|---|
| | | B2H6 flowrate/ pulse time | WF6 flowrate/ pulse time | | |
| D | 1 B2H6/WF6 cycle + 3 SH4/WF6 cycles (in presence of H2) | 200 sccm/ 1 sec | 0/0 | 5.97 | 13.59 |
| E | 5 B2H6/WF6 cycles (no H2) | 250 sccm/ 0.5 sec | 0/0 | 1.83 | 10.09 |

TABLE 2-continued

| Process | Nucleation Layer Deposition Sequence | Treatment - 5 cycles | | 4 mm EE Rs % NU | Resistivity at 600 Å (μΩ-cm) |
|---|---|---|---|---|---|
| | | B2H6 flowrate/ pulse time | WF6 flowrate/ pulse time | | |
| F | 5 B2H6/WF6 cycles (no H2) | 200 sccm/ 0.5 sec | 0/0 | 1.65 | 11.42 |

As indicated above, the quality of all films as measured by number defects were about the same. Optimized for fewer defects, processes D and F show significantly improved resistivity (10.09 and 11.42 μΩ-cm as compared to 13.59 μΩ-cm) and resistance non-uniformity (1.83% and 1.65% as compared to 5.97%).

Example 3

Similarly, when tuned for low resistivity, processes as shown in FIG. 4a result in lower particle counts and micro-peeling for similar resistivities:

TABLE 3

| Process | Nucleation Layer Deposition Sequence | Treatment - 5 cycles | | Resistivity at 600 Å (μΩ-cm) | Micro-peeling observed? |
|---|---|---|---|---|---|
| | | B2H6 flowrate/ pulse time | WF6 flowrate/ pulse time | | |
| G | 1 B2H6/WF6 cycle + 3 SH4/WF6 cycles (in presence of H2) | 350 sccm/ 1 sec | 0/0 | 9.83 | Yes |
| H | 5 B2H6/WF6 cycles (no H2) | 250 sccm/ 1 sec | 0/0 | 9.76 | No or reduced** |

**For particular split shown here, micropeeling was not measured; however from other experiments, it was shown that Process H results in no or reduced micropeeling compared to Process G.

Example 4

Various processes according to the embodiment shown in FIG. 4a were used to deposit and treat tungsten nucleation layers. In particular, the nucleation layer was deposited according to the sequence described in Tables 1 and 2 for processes C, E and F. Tungsten-containing precursors and boron-containing reducing agent flow rates and pulse times were varied in the following ranges:
Tungsten-containing precursor ($WF_6$) flow rate: 75-150 sccm;
Tungsten-containing precursor ($WF_6$) pulse time 0.5-1.5 seconds;
Boron-containing reducing agent ($B_2H_6$) flow rate: 200-300 sccm;
Boron-containing reducing agent ($B_2H_6$) pulse time: 0.5-1 seconds.
Pulses were uniform for the treatment processes, i.e., the same $WF_6$ flow rate, $WF_6$ pulse time, $B_2H_6$ flow rate and $B_2H_6$ pulse time were used for each of the multiple treatment pulses of a particular process. CVD layers were deposited on each of the nucleation layers and resistivity, resistance non-uniformity and particle counts were examined. Based on the resulting experimental data, a prediction was made optimizing the particle count, resistivity and resistance non-uniformity. The predicted optimized process (WF$_6$ pulse of 0.5 seconds and 125 sccm; B$_2$H$_6$ pulse of 0.5 seconds and 270 sccm) was then used to form a tungsten nucleation layer on which a CVD tungsten film was deposited. This is a just an example of pulse times and flow rates; depending on the particular process conditions and desired results, others may be used.

Example 5

The following processes were compared:
Process I
Nucleation layer formed by: B2H6/Ar purge/WF6/Ar purge (1 cycle) followed by SiH4/Ar purge/WF6/Ar purge (5 cycles) at 300° C. and 40 Torr in H2 ambient. Bulk fill by WF6 CVD with H2 reduction at 395° C.
Process J
Nucleation layer formed by: B2H6/Ar purge/WF6/Ar purge in H2 absence (5 cycles). Low resistivity treatment by B2H6/Ar purge (6 cycles) at 395° C. in H2 ambient. Bulk fill by WF6 CVD with H2 reduction at 395° C.
FIG. 6 shows XRD spectra from each of the films; process I labeled as the conventional PNL nucleation process and process J labeled as B2H6/WF6 no H2 process. As discussed above, the spectra indicates that the conventional film is crystalline and the nucleation layer formed by the boron-based, no hydrogen process amorphous. Plugfill experiments on 10:1 AR features show that for process I, a nucleation film of at least 23 Å is required to achieve good plugfill step coverage. Insufficient nucleation layer near the feature bottom causes delay in the ensuing H2-WF6 CVD reaction and a void in the feature. However, for process J, excellent plugfill step coverage is achieved with as little as 12 μΩ-cm of nucleation film. It has also been found that the resistivity of this nucleation film (55 μΩ-cm for 25 Å) is lower than that for the PNL nucleation film formed by process 1 (76 μΩ-cm for 25 Å).

For 500 Å film deposited on PVD TiN, W grain size on a blanket wafer is three times larger using Process J over Process I.

Example 6

To validate the effect of tungsten grain size differences on electrical performance, line resistance measurements were performed on 90 nm (AR 2:1) lines. 75 Å Ti and 120 Å CVD-TiN were used as liner and barrier respectively. Four processes were used for this study as shown below in Table 4.

TABLE 4

| | Nucleation | Treatment | Drop in median line resistance from conventional PNL (process 4) |
|---|---|---|---|
| 1 | B2H6/WF6 no H2 (5 cycles) | B2H6 at 395° C. in H2 (6 cycles) | 42% |
| 2 | B2H6/WF6 no H2 (5 cycles) | None | 32% |
| 3 | B2H6/WF6 (1 cycle) followed by SiH4/WF6 (5 cycles) | B2H6 at 395° C. in H2 (6 cycles) | 22% |
| 4 | B2H6/WF6 (1 cycle) followed by SiH4/WF6 (5 cycles) | None | — |

Compared to conventional PNL nucleation film, the boron-based nucleation film used in processes 1 and 2 results in reduced line resistivity due to (i) larger in-trench W grain size resulting in less electron scattering at the grain boundaries (ii) lower resistivity of the nucleation film and (iii) higher percentage of the CVD W fill due to thinner nucleation. The low resistivity treatment used in processes 1 and 3 also causes line resistivity reduction by promoting large grain growth during CVD fill.

Example 7

A W nucleation layer was formed in features having an AR of 8.5:1 and a top opening was 0.14 μm at 300° C. using tungsten nucleation layer deposition sequences shown in the table below. Nucleation layers of about 40 Å for process A*, about 40 Å for process B* and about 40 Å for process K were deposited. (Processes A* and B* are the same processes A and B shown in Table 1 of Example 1 in a different experiment). Treatment operations were then performed using sequences shown below at 395° C. (Note that for process A*, the 'treatment' involved a B2H6/WF6 cycle having longer pulse duration; tungsten film was deposited during this step.) A bulk tungsten layer was then deposited on each nucleation layer. Resistivity at 600 Angstroms and resistance non-uniformity at 4 mm edge exclusion were measured. The films were also examined for areas of micro-peeling. Process conditions and results are shown below in Table 5.

TABLE 5

| Process | Nucleation Layer Deposition Sequence | Treatment Sequence | Resistivity at 600 Angstroms (μΩ-cm) | 4 mm EE Rs % NU | Micro-peeling observed? |
|---|---|---|---|---|---|
| A* | 1 B2H6/WF6 cycle + 4 SH4/WF6 cycles (in presence of H2) | 1 B2H6/WF6 cycle - with tungsten deposition | 13 | * | Very little or none |
| B* | 1 B2H6/WF6 cycle + 3 SH4/WF6 cycles (in presence of H2) | 5 B2H6 pulse | 10 | about 2% | Yes |
| K | 1 B2H6/WF6 cycle + 3 SH4/WF6 cycles (in presence of H2) | 5 B2H6/WF6 - no tungsten deposition | 10.6 | about 4% | Very little |

*No data; prediction of 7-9%

Processes B* and K, which have multiple pulse treatment operations, provide improved resistivity over process A*. Process K, which uses WF6 pulses in the treatment operation provides the resistivity benefits seen with process B*, but without any micro-peeling.

Apparatus

The methods of the invention may be carried out in various types of deposition apparatus available from various vendors. Examples of suitable apparatus include a Novellus Concept-1 Altus, a Concept 2 Altus, a Concept-2 ALTUS-S, a Concept 3 Altus deposition system, or any of a variety of other commercially available CVD tools. In some cases, the process can be performed on multiple deposition stations sequentially. See, e.g., U.S. Pat. No. 6,143,082, which is incorporated herein by reference for all purposes. In some embodiments, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface.

In one example, after a tungsten nucleation layer is deposited, the wafer is moved to a second station for part or all of a treatment process and a new wafer is moved into place on the first station. The wafers may be indexed from one station to the next to enable parallel wafer processing.

Figure 7:
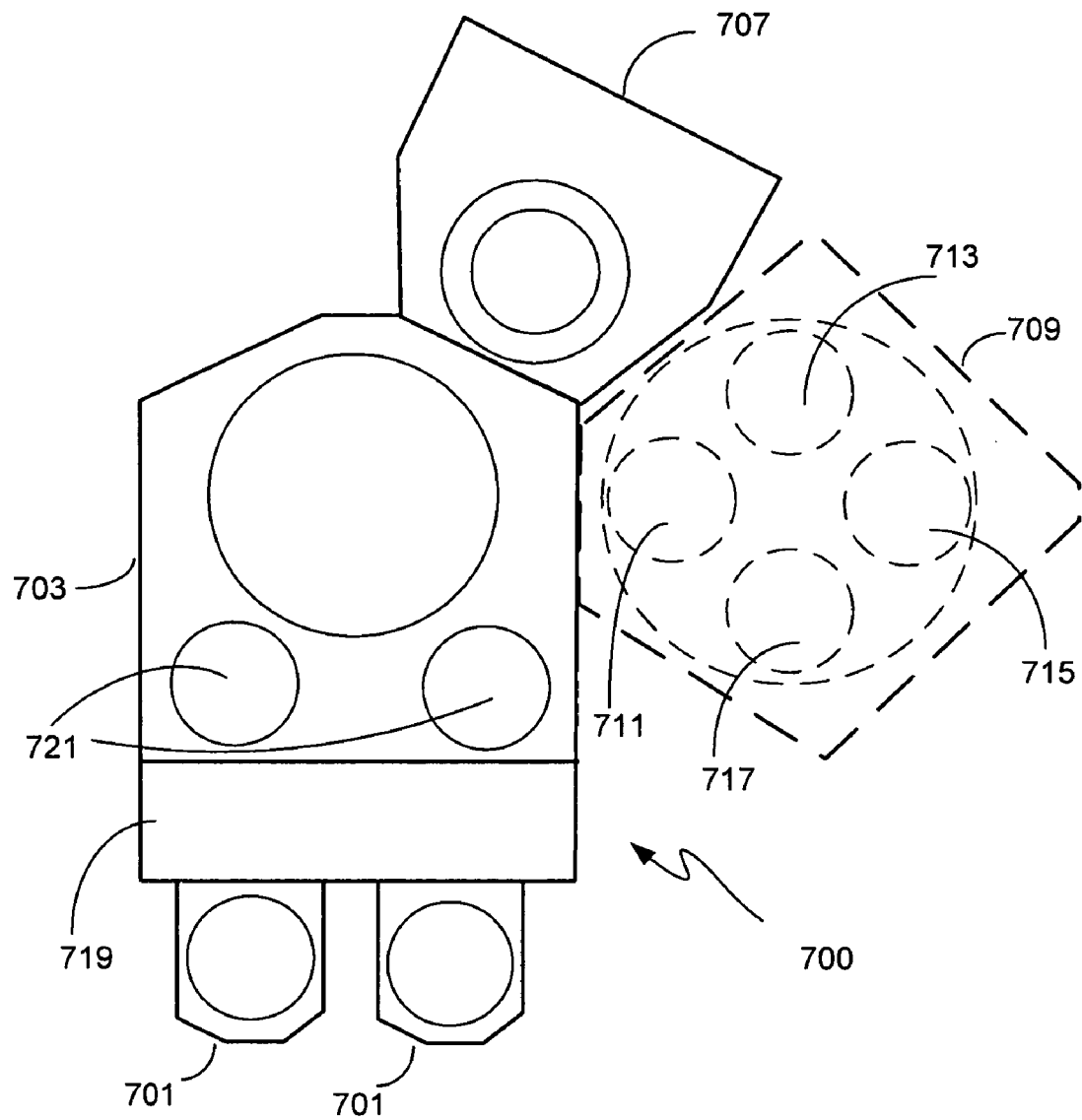
FIG. 7 is a block diagram of a processing system suitable for conducting tungsten deposition process in accordance with embodiments of the invention.

FIG. 7 is a block diagram of a processing system suitable for conducting tungsten thin film deposition processes in accordance with embodiments of the invention. The system 700 includes a transfer module 703. The transfer module 703 provides a clean, pressurized environment to minimize the risk of contamination of substrates being processed as they are moved between the various reactor modules. Mounted on the transfer module 703 is a multi-station reactor 709 capable of performing PNL deposition, multi-pulse treatment, and CVD according to embodiments of the invention. Chamber 709 may include multiple stations 711, 713, 715, and 717 that may sequentially perform these operations. For example, chamber 709 could be configured such that station 711 performs PNL deposition, station 713 performs multi-pulse treatment, and stations 715 and 717 perform CVD.

Also mounted on the transfer module 703 may be one or more single or multi-station modules 707 capable of performing plasma or chemical (non-plasma) pre-cleans. The module may also be used for various other treatments, e.g., post liner tungsten nitride treatments. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

In certain embodiments, a system controller is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the invention in a single or multi-chamber semiconductor processing tool.

Applications

The present invention may be used to deposit thin, low resistivity tungsten layers for many different applications. One preferred application is for interconnects in integrated circuits such as memory chips and microprocessors. Interconnects are current lines found on a single metallization layer and are generally long thin flat structures. These may be formed by a blanket deposition of a tungsten layer (by a process as described above), followed by a patterning operation that defines the location of current carrying tungsten lines and removal of the tungsten from regions outside the tungsten lines.

A primary example of an interconnect application is a bit line in a memory chip. Of course, the invention is not limited to interconnect applications and extends to vias, contacts and other tungsten structures commonly found in electronic devices. In general, the invention finds application in any environment where thin, low-resistivity tungsten layers are required.

Another parameter of interest for many applications is a relatively low roughness of the ultimately deposited tungsten layer. Preferably, the roughness of the tungsten layer is not greater than about 10% of the total thickness of the deposited tungsten layer, and more preferably not greater than about 5% of the total thickness of the deposited tungsten layer. The roughness of a tungsten layer can be measured by various techniques such as atomic force microscopy.

Figure 5:
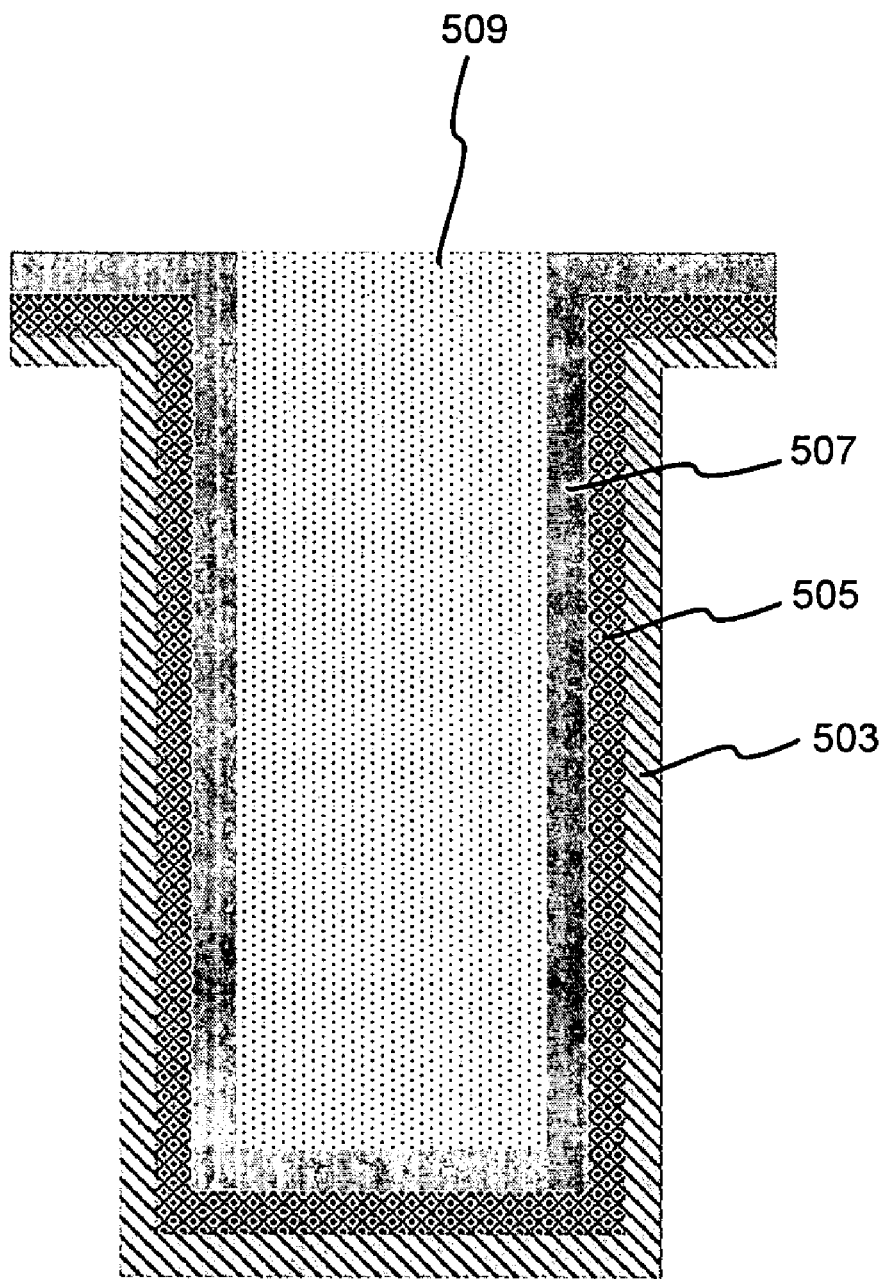
FIG. 5 is a simple cross-sectional diagram of a film stack including a titanium adhesion layer together with a tungsten nucleation layer and a tungsten bulk layer formed in accordance with this invention.

FIG. 5 is a cross-section illustrations of a film stack that can be formed using methods of the invention. The film stack may represent interconnect applications as described previously. The film stack of FIG. 5 is formed in an underlying substrate having a feature in which tungsten is to be deposited. The feature may be a single component or more commonly a complex multi-feature structure having various conductive, insulating, and semiconductor components. For example, the substrate may have a top layer comprising silicon or a dielectric such as silicon dioxide. Contacting the substrate is, in the following order, a titanium layer 503, a titanium nitride layer 505, a tungsten nucleation layer 507 (formed in accordance with this invention) and a tungsten bulk layer 509. Titanium layer 503 is typically deposited by a CVD process which provides reasonably good adhesion to the underlying substrate 501. Titanium nitride layer 505 is typically deposited using CVD or PVD methods and is used to protect the underlying titanium and/or silicon from exposure to tungsten hexafluoride ($WF_6$) during subsequent tungsten deposition. It has been found that $WF_6$ reacts very aggressively and sometimes explosively with titanium. Tungsten nucleation layer 507 and tungsten bulk layer 509 are formed in accordance with the methods of the present invention as described above. In interconnect applications as described above, layers 503, 505, 507 and 509 are all etched to form interconnect lines. In another embodiment, a tungsten nitride layer is employed instead of the Ti/TiN layer.

OTHER EMBODIMENTS

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method of forming a tungsten film on a substrate, the method comprising:
    exposing the substrate to alternating pulses of a tungsten-containing precursor and a reducing agent to thereby deposit a tungsten nucleation layer on the substrate;
    performing a treatment operation on the deposited tungsten nucleation layer, wherein the treatment operation comprises exposing the tungsten nucleation layer to at least two cycles of alternating pulses of a boron-containing compound and a tungsten-containing precursor wherein no more than an atomic monolayer of tungsten is deposited on the tungsten nucleation layer during said treatment operation; and
    depositing a tungsten bulk layer over the treated tungsten nucleation layer to form the tungsten film.

2. The method of claim 1 wherein treating the deposited tungsten nucleation layer lowers resistivity of deposited tungsten film.

3. The method of claim 1 wherein treating the deposited tungsten nucleation layer lowers the resistivity of the nucleation film.

4. The method of claim 1 wherein the treatment operation is performed at a substrate temperature of between about 350° C.-415° C.

5. The method of claim 1 wherein the treatment operation is performed at a substrate temperature of about 395° C.

6. The method of claim 1 wherein deposition of the tungsten nucleation layer is performed at a substrate temperature of between about 250° C.-310° C. and the treatment operation is performed at a temperature of between about 350° C.-415° C.

7. The method of claim 1 wherein the treatment operation comprises between 2 and 8 alternating pulses of a boron-containing compound and a tungsten-containing precursor.

8. The method of claim 1 wherein deposition of the tungsten nucleation layer is performed at a substrate temperature of between about 250° C.-350° C.

9. The method of claim 1 wherein deposition of the tungsten nucleation layer is performed at a substrate temperature of between about 300° C.

10. The method of claim 1 wherein deposition of the tungsten nucleation layer is performed at a substrate temperature of between about 250° C.-325° C. wherein substantially no hydrogen is flowed during or between the pulses.

11. The method of claim 10 wherein the treatment operation is performed at a temperature of between about 350° C.-415° C. with hydrogen flowing in the background.

12. The method of claim 1 wherein transition from the deposition of the tungsten nucleation layer to the treatment operation comprises turning on a flow of hydrogen.

13. The method of claim 1 wherein the resistivity of the tungsten film at 600 Angstroms is no more than about 11 $\mu\Omega$-cm.

14. The method of claim 1 wherein the deposition of the tungsten nucleation layer is performed at a substrate temperature of between about 250° C.-325° C. with hydrogen flowed during or between the pulses of the tungsten-containing precursor and the reducing agent.

15. The method of claim 1 wherein the reducing agent is silane.

16. A method of forming a tungsten film on a substrate, the method comprising:
    forming a tungsten nucleation layer on the substrate by alternating pulses of a boron-containing reducing agent and a tungsten-containing precursor at a substrate temperature of between about 250° C.-350° C., wherein no hydrogen is flowed during or between the pulses;
    performing a treatment operation on the deposited tungsten nucleation layer, wherein the treatment operation comprises exposing the tungsten nucleation layer to at least two cycles of alternating pulses of a borane and a tungsten-containing precursor, wherein no more than an atomic monolayer of tungsten is deposited on the tungsten nucleation layer during said treatment operation; and
    depositing a tungsten bulk layer over the treated tungsten nucleation layer to form the tungsten film.

17. The method of claim 16 wherein the resistivity of the tungsten film at 600 Angstroms is no more than about 11 $\mu\Omega$-cm.

18. A method of forming a tungsten layer, comprising:
    positioning a substrate having a recessed feature in a deposition station within a deposition chamber;
    forming a conformal tungsten nucleation layer in at least the feature by alternating pulses of a reducing agent and a tungsten-containing precursor at a substrate temperature of between about 250° C.-350° C., wherein forming the conformal tungsten nucleation layer comprises alternating pulses of a boron-containing reducing agent and a tungsten containing precursor, wherein no hydrogen is flowed during or between pulses;
    performing a treatment operation on the deposited tungsten nucleation layer, wherein the treatment operation comprises exposing the tungsten nucleation layer to multiple pulses of a boron-containing reducing agent at a substrate temperature of at least about 350° C. wherein no more than an atomic monolayer of tungsten is deposited on the tungsten nucleation layer during said treatment operation; and substantially filling the feature with a tungsten bulk layer by exposing the substrate to a tungsten-containing precursor and hydrogen at a substrate temperature of at least about 350° C. to thereby deposit tungsten by a chemical vapor deposition process in at least the feature.

19. The method of claim 18, wherein the multiple pulses of the boron-containing reducing agent during the nucleation layer treatment are performed in the presence of hydrogen and transitioning from the nucleation layer deposition to nucleation layer treatment comprises turning on a flow of hydrogen.

20. The method of claim 18, wherein the exposing the substrate to the multiple pulses of boron-containing reducing agent comprises exposing the substrate to alternating pulses of boron-containing reducing agent and a tungsten-containing precursor.

21. The method of claim 18, wherein the substrate temperature during the treatment operation is at least about 375° C.

* * * * *